(12) United States Patent
Ahn et al.

(10) Patent No.: US 9,595,385 B2
(45) Date of Patent: Mar. 14, 2017

(54) MULTILAYER CERAMIC CAPACITOR AND BOARD WITH THE SAME MOUNTED THEREON

(71) Applicant: SAMSUNG ELECTRO-MECHANICS CO., LTD., Suwon-Si, Gyeonggi-Do (KR)

(72) Inventors: Young Ghyu Ahn, Suwon-Si (KR); Min Cheol Park, Suwon-Si (KR); Sang Soo Park, Suwon-Si (KR); Byoung Hwa Lee, Suwon-Si (KR)

(73) Assignee: SAMSUNG ELECTRO-MECHANICS CO., LTD., Suwon-si, Gyeonggi-do (KR)

(*) Notice: Subject to any disclaimer, the term of this patent is extended or adjusted under 35 U.S.C. 154(b) by 262 days.

(21) Appl. No.: 14/282,939

(22) Filed: May 20, 2014

(65) Prior Publication Data
US 2015/0170841 A1 Jun. 18, 2015

(30) Foreign Application Priority Data

Dec. 16, 2013 (KR) .................... 10-2013-0156583

(51) Int. Cl.
| | |
|---|---|
| H01G 4/06 | (2006.01) |
| H01G 2/06 | (2006.01) |
| H01G 4/30 | (2006.01) |
| H05K 1/11 | (2006.01) |
| H01G 4/012 | (2006.01) |
| H01G 4/232 | (2006.01) |
| H05K 3/34 | (2006.01) |

(52) U.S. Cl.
CPC ............ *H01G 2/065* (2013.01); *H01G 4/012* (2013.01); *H01G 4/232* (2013.01); *H01G 4/30* (2013.01);
(Continued)

(58) Field of Classification Search
CPC . H01C 1/148; H01C 7/18; H01C 7/13; H05K 1/18; H05K 1/111; H05K 1/181;
(Continued)

(56) References Cited

U.S. PATENT DOCUMENTS 5,723,395 A * 3/1998 Suzuki .................. C04B 35/453
501/134
7,056,136 B2 6/2006 Iwasaki
(Continued)

FOREIGN PATENT DOCUMENTS

CN 1427429 A 7/2003
JP 2010-177572 A 8/2010
(Continued)

OTHER PUBLICATIONS

Korean Office Action issued in Korean Application No. 10-2013-0156583 dated Feb. 13, 2015, with English Translation.
(Continued)

*Primary Examiner* — Timothy Thompson
*Assistant Examiner* — Guillermo Egoavil
(74) *Attorney, Agent, or Firm* — McDermott Will & Emery LLP (57) ABSTRACT

A multilayer ceramic capacitor may include: a ceramic body including a plurality of dielectric layers; a capacitor unit disposed in an upper portion of the ceramic body and including a plurality of first and second internal electrodes; an equivalent series resistance (ESR) controller disposed in a lower portion of the ceramic body and including a plurality of third and fourth internal electrodes; a gap layer disposed between the capacitor unit and the ESR controller; first and second external electrodes disposed on the first and second end surfaces of the ceramic body and electrically connected to the first and second internal electrodes; and third and fourth external electrodes disposed on the first and second lateral surfaces of the ceramic body and electrically connected to the third and fourth internal electrodes.

15 Claims, 9 Drawing Sheets

A-A'

(52) U.S. Cl.
CPC ............ *H05K 1/111* (2013.01); *H05K 3/3442* (2013.01); *H05K 2201/10015* (2013.01); *H05K 2201/2045* (2013.01); *Y02P 70/611* (2015.11)

(58) Field of Classification Search
CPC .... H05K 1/0231; H05K 1/185; H05K 3/4602; H05K 3/3442; H05K 7/00; H05K 2201/2045; H05K 2201/10636; H05K 2201/10674; H01G 2/065; H01G 4/005; H01G 4/06; H01G 4/228; H01G 4/232; H01G 4/248; H01G 4/2325; H01G 4/30; H01G 4/12; H01G 4/224; H01L 23/645; H01L 21/4857; H01L 24/16; H01L 2924/01005; H01L 2924/01019; H01L 2924/01082; H01L 2924/01025; H01L 2924/01078; H01L 2924/01052; H01L 2924/15312; H01L 2224/82039; H01L 25/16; H01L 41/0471; H01L 41/047; Y02P 70/613; Y02P 70/611; Y10T 29/435
USPC ......... 174/260, 258; 310/311, 366; 336/200; 338/22 R, 21; 361/321.2, 301.3, 764, 361/301.4, 306.3, 321.1, 306.1, 305, 311, 361/309, 303
See application file for complete search history.

(56) References Cited

U.S. PATENT DOCUMENTS

| | | | |
|---|---|---|---|
| 2003/0102502 A1 | 6/2003 | Togashi | |
| 2009/0059469 A1* | 3/2009 | Lee | H01G 4/012 361/306.2 |
| 2009/0139757 A1* | 6/2009 | Lee | H01G 4/005 174/260 |
| 2009/0244803 A1* | 10/2009 | Lee | H01G 4/012 361/301.4 |
| 2011/0307235 A1* | 12/2011 | Wu | G06F 17/5036 703/14 |
| 2012/0162853 A1 | 6/2012 | Togashi | |

FOREIGN PATENT DOCUMENTS

JP  2012-138415 A  7/2012
KR  10-2009-0022878 A  3/2009

OTHER PUBLICATIONS

Chinese Office Action dated Dec. 30, 2016 issued in Chinese Patent Application No. 201410230850.0 (with English translation).

\* cited by examiner

MULTILAYER CERAMIC CAPACITOR AND BOARD WITH THE SAME MOUNTED THEREON

CROSS-REFERENCE TO RELATED APPLICATION

This application claims the benefit of Korean Patent Application No. 10-2013-0156583 filed on Dec. 16, 2013, with the Korean Intellectual Property Office, the disclosure of which is incorporated herein by reference.

BACKGROUND

The present disclosure relates to a multilayer ceramic capacitor and a board with the same mounted thereon.

A multilayer ceramic capacitor (MLCC), a multilayer chip electronic component, is a chip-type condenser mounted on a circuit board of various electronic products including display devices such as liquid crystal displays (LCDs), plasma display panels (PDPs), and the like, computers, smartphones, cellular phones, and the like, to charge and discharge electricity.

MLCCs may be used as components in various electronic devices, due to advantages such as compactness, high capacitance, and ease of mountability.

An MLCC may have a structure including a plurality of dielectric layers and internal electrodes, and the internal electrodes having different polarities may be alternately stacked with at least one of the dielectric layers interposed therebetween.

In particular, a power supply device for a central processing unit (CPU) of a computer, or the like, has a problem in which voltage noise is generated due to a rapid change in a load current in the process of providing low voltage.

Also, as efficiency of power supply devices weighs increasingly, a faster switching speed is required to reduce loss.

However, an increase in a switching speed may trigger negative phenomena such as an increase in electromagnetic interference (EMI).

Also, a field effect transistor (FET) constituting a DC/DC converter performs switching, ringing occurs due to inductance of a wiring and parasitic capacitance of the FET, generating high frequency noise to cause interference in a peripheral circuit.

Namely, resonance occurs due to inductance of the wiring and capacitance of the switching element, causing EMI.

In particular, in a small portable terminal such as a smartphone, a tablet personal computer (PC), or the like, analog circuits such as a power circuit, a wireless circuit, an audio circuit, and the like, are adjacent to each other, acting as a factor causing communication interference or degrading sound quality.

In general, in order to solve the above problems, addition of a C-R snubber to an FET has been studied, but this method involves a problem of degrading conversion efficiency of a DC/DC converter because a partial amount of power is consumed by the C-R snubber during a switching operation.

Thus, a method of reducing noise by suppressing ringing, while preventing degradation in conversion efficiency of a DC/DC converter, is still required.

SUMMARY

An aspect of the present disclosure may provide a multilayer ceramic capacitor which operates as a capacitor in a low frequency region and operates as a resistor in a high frequency region, thus canceling electromagnetic interference (EMI) noise without degrading efficiency of a DC/DC converter.

According to an aspect of the present disclosure, a multilayer ceramic capacitor may include: a ceramic body including a plurality of dielectric layers, first and second main surfaces opposing one another in a thickness direction, first and second end surfaces opposing one another in a length direction, and first and second lateral surfaces opposing one another in a width direction; a capacitor unit disposed in an upper portion of the ceramic body and including a plurality of first and second internal electrodes stacked with the dielectric layers interposed between the first and second internal electrodes while being alternately exposed to the first and second end surfaces of the ceramic body; an equivalent series resistance (ESR) controller disposed in a lower portion of the ceramic body and including a plurality of third and fourth internal electrodes stacked with the dielectric layers interposed between the third and fourth electrodes while being alternately exposed to the first and second lateral surfaces of the ceramic body; a gap layer disposed between the capacitor unit and the ESR controller; first and second external electrodes disposed on the first and second end surfaces of the ceramic body and electrically connected to the first and second internal electrodes; and third and fourth external electrodes disposed on the first and second lateral surfaces of the ceramic body and electrically connected to the third and fourth internal electrodes.

The third and fourth internal electrodes may have first and second lead portions exposed to the first and second lateral surfaces of the ceramic body.

The first and second lead portions may be disposed to primarily extend from the third and fourth internal electrodes toward the first and second lateral surfaces of the ceramic body, be bent in the length direction and secondarily extend along the first and second lateral surfaces, and be bent in the width direction and tertiarily extend to the first and second lateral surfaces.

The first and second lead portions may linearly extend from the third and fourth internal electrodes to the first and second lateral surfaces of the ceramic body.

The third and fourth internal electrodes may have at least one recess portion provided to be adjacent to the first and second lead portions.

The first main surface of the ceramic body of the MLCC may be a mounting surface.

The ESR controller may have higher ESR than the capacitor unit and may have lower equivalent series inductance (ESL) than the capacitor unit.

When a distance from the mounting surface of the ceramic body to a lower end of the ESR controller is defined as A and a distance from the mounting surface of the ceramic body to a lower end of the capacitor unit is defined as B, $2.959 \leq B/A \leq 18.576$ may be satisfied.

When a distance from the mounting surface of the ceramic body to a lower end of the capacitor unit is defined as B and a distance from the mounting surface of the ceramic body to an upper end of the ESR controller is defined as C, $150.1\ \mu m \leq B-C \leq 1387.8\ \mu m$ may be satisfied.

According to another aspect of the present disclosure, a board with a multilayer ceramic capacitor mounted thereon may include: a board having first and second electrode pads disposed to be spaced apart from one another in a length direction and third and fourth electrode pads disposed to be spaced apart from one another in a width direction between the first and second electrode pads; and the multilayer ceramic capacitor as described above mounted on the board.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Exemplary embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

In order to clarify exemplary embodiments of the present disclosure, directions of a hexahedral body may be defined as follows: L, W, and T in FIG. 1 denote a length direction, a width direction, and a thickness direction, respectively.

Multilayer Ceramic Capacitor (MLCC)

Figure 1:
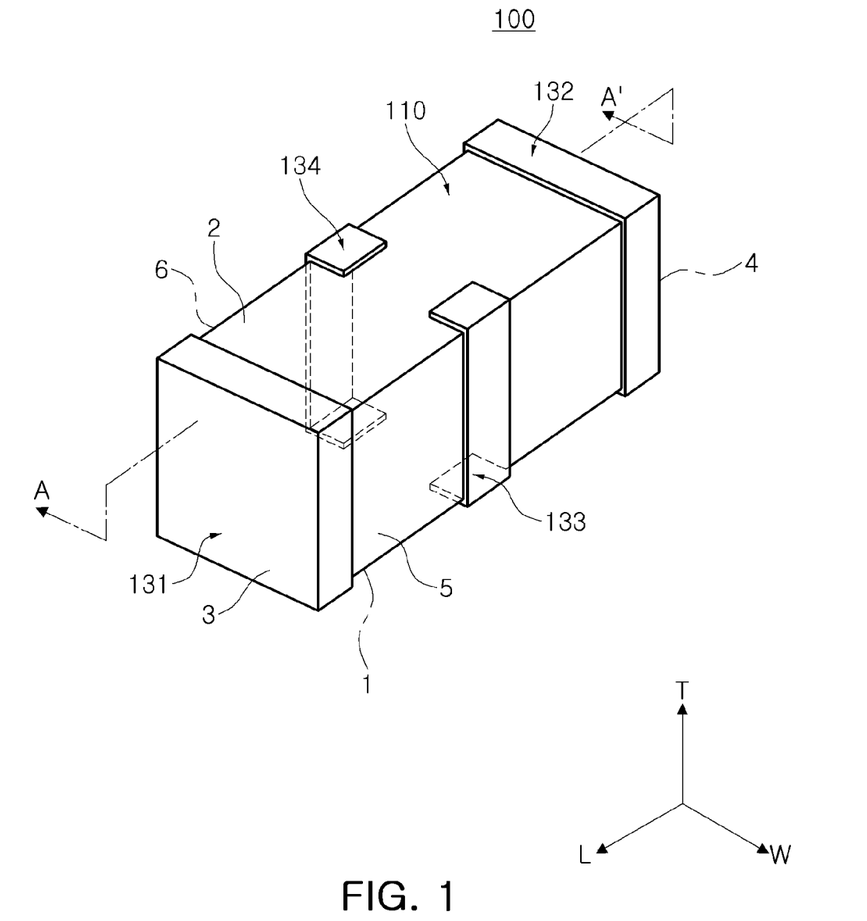
FIG. 1 is a perspective view schematically illustrating a multilayer ceramic capacitor (MLCC) according to an exemplary embodiment of the present disclosure.
Figure 2:
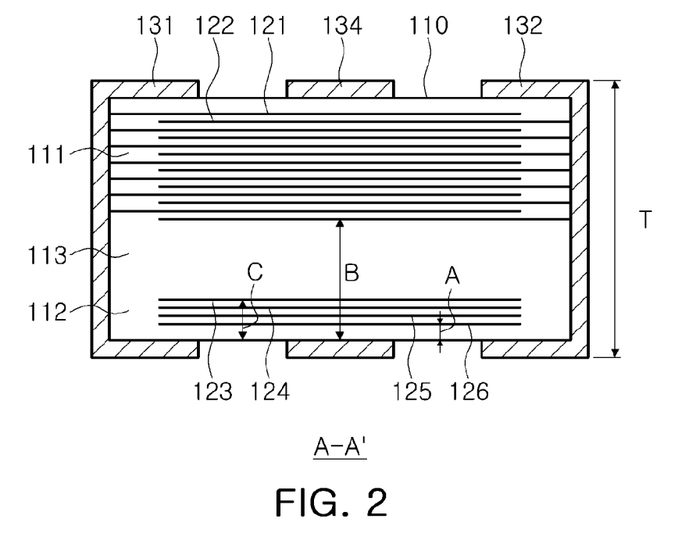
FIG. 2 is a cross-sectional view taken along line A-A' in FIG. 1.

FIG. 1 is a perspective view schematically illustrating a multilayer ceramic capacitor (MLCC) according to an exemplary embodiment of the present disclosure, and FIG. 2 is a cross-sectional view taken along line A-A' in FIG. 1.

An MLCC 100 according to the present exemplary embodiment includes a ceramic body 110 in which a plurality of dielectric layers 111 and 112 are stacked, a capacitor unit disposed in an upper portion of the ceramic body 110 and including a plurality of first and second internal electrodes 121 and 122, an equivalent series resistance (ESR) controller disposed in a lower portion of the ceramic body 110, namely, on a mounting surface, and including a plurality of third and fourth internal electrodes 123 to 126, a gap layer 113 disposed between the capacitor unit and the ESR controller, and first to fourth external electrodes 131 to 134.

Namely, the MLCC 100 according to the present exemplary embodiment may be a so-called 4-terminal capacitor having a total of four external electrodes.

Referring to FIGS. 1 and 2, the ceramic body 110 is formed by stacking a plurality of dielectric layers 111 and 112 and subsequently sintering the same, and adjacent dielectric layers 111 and 112 may be integrated such that boundaries therebetween may not be readily apparent.

The ceramic body 110 may have a hexahedral shape.

In the present exemplary embodiment, surfaces of the ceramic body 110 opposing one another in the thickness direction will be defined as first and second main surfaces 1 and 2, surfaces of the ceramic body 110 connecting the first and second main surfaces 1 and 2 and opposing one another in the length direction will be defined as first and second end surfaces 3 and 4, and surfaces of the ceramic body 110 opposing one another in the width direction will be defined as first and second lateral surfaces 5 and 6.

The dielectric layers 111 and 112 may be formed of a ceramic material having high permittivity, e.g., a barium titanate ($BaTiO_3$)-based ceramic powder, or the like, but is not limited thereto, and any material may be used as long as it can obtain sufficient capacitance.

Also, the dielectric layers 111 and 112 may further include various ceramic additives such as a transition metal oxide or carbide, a rare earth element, magnesium (Mg), aluminum (Al), or the like, an organic solvent, a plasticizer, a binder, a dispersing agent, and the like, as necessary, together with the ceramic powder.

Figure 3:
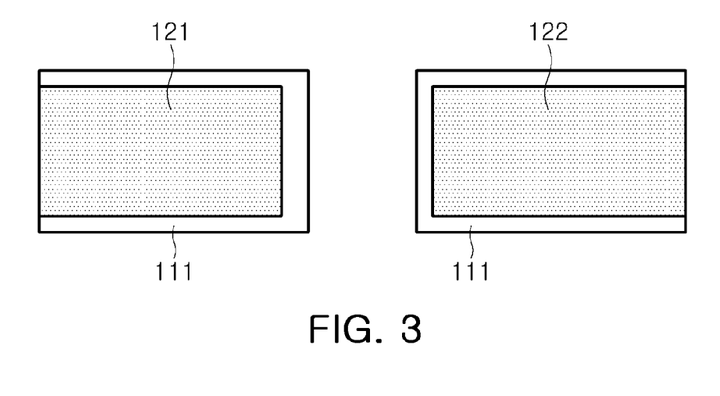
FIG. 3 is a plan view illustrating first and second internal electrodes of an MLCC according to an exemplary embodiment of the present disclosure.

FIG. 3 is a plan view illustrating the first and second internal electrodes of the MLCC according to the exemplary embodiment of the present disclosure.

Referring to FIG. 3, the first and second internal electrodes 121 and 122 constituting the capacitor unit have different polarities, are formed on at least one surfaces of ceramic sheets forming the dielectric layers 111, and are alternately stacked with each of the dielectric layers 111 interposed therebetween within the ceramic body 110 while being exposed to the first and second end surfaces 3 and 4.

In this case, the first and second internal electrodes 121 and 122 may include a capacitance portion in which the first and second internal electrodes 121 and 122 overlap in the thickness direction to form capacitance and lead portions led out to the first and second end surfaces 3 and 4 of the ceramic body 110 so as to be connected to the first and second external electrodes 131 and 132.

Also, the first and second internal electrodes 121 and 122 are electrically insulated from each other by the dielectric layer 111 interposed therebetween.

Capacitance of the MLCC 100 may be in proportion to an area of the first and second internal electrodes 121 and 122 that overlap in the stacked direction of the dielectric layers 111 within the capacitor unit.

Also, the first and second internal electrodes 121 and 122 may be formed of a conductive metal. For example, silver (Ag), palladium (Pd), platinum (Pt), nickel (Ni), copper (Cu), or an alloy thereof may be used, but the present disclosure is not limited thereto.

Figure 4:
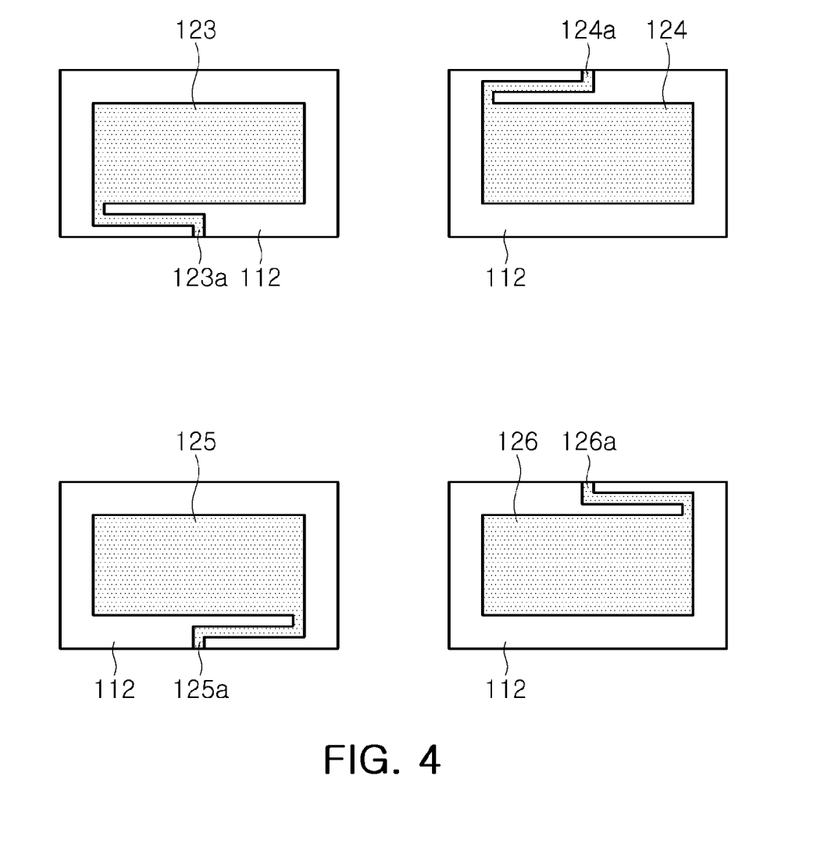
FIG. 4 is a plan view illustrating third and fourth internal electrodes of an MLCC according to an exemplary embodiment of the present disclosure.

FIG. 4 is a plan view illustrating the third and fourth internal electrodes of the MLCC according to the exemplary embodiment of the present disclosure.

Referring to FIG. 4, the ESR controller serves to adjust equivalent series resistance (ESR) of the MLCC 100, and it may have high ESR and low equivalent series inductance (ESL), relative to the capacitor unit.

The third and fourth internal electrodes 123 to 126 constituting the ESR controller may be formed on at least one surfaces of ceramic sheets forming the dielectric layers 112 and alternately stacked with the dielectric layers 112 interposed therebetween within the ceramic body 110 while exposed to the first and second lateral surfaces 5 and 6 of the ceramic body 110.

In this case, the third and fourth internal electrodes 123 to 126 may include an overlapping portion in which the third and fourth internal electrodes 123 to 126 overlap in the thickness direction and first and second lead portions 123*a* to 126*a* extending from the overlapping portion to the first and second lateral surfaces 5 and 6 of the ceramic body 110 so as to be connected to the third and fourth external electrodes 133 and 134.

The third and fourth internal electrodes 123 to 126 are electrically insulated by the dielectric layers 112 disposed therebetween.

Here, the third and fourth internal electrodes 123 and 124 and the third and fourth internal electrodes 125 and 126 have first and second lead portions which are bilaterally symmetrical, and other structures thereof are identical to each other.

In this case, the first and second lead portions 123*a* to 126*a* primarily extend from the third and fourth internal electrodes 123 to 126 toward the first and second lateral surfaces 5 and 6 of the ceramic body 110, are bent in the length direction and secondarily extend along the first and second end surfaces 3 and 4, and are bent in the width direction, and are bent in the width direction and tertiarily extend to edges of the first and second lateral surfaces 5 and 6.

Also, the third and fourth internal electrodes 123 to 126 are formed of a conductive metal. For example, the third and fourth internal electrodes 123 to 126 may be formed of silver (Ag), palladium (Pd), platinum (Pt), nickel (Ni), copper (Cu), or an alloy thereof, but the present disclosure is not limited thereto.

The gap layer 113 may have the same material and configuration as those of the dielectric layers 111 and 112, except that it does not include an internal electrode.

The gap layer 113 may be formed of a single dielectric layer or may be formed by stacking two or more dielectric layers in the thickness direction of the ceramic body.

The first and second external electrodes 131 and 132 are formed on the first and second end surfaces 3 and 4, and the third and fourth external electrodes 133 and 134 are formed on the first and second lateral surfaces 5 and 6 of the ceramic body 110 and spaced apart from the first and second external electrodes 131 and 132.

The first and second external electrodes 131 and 132 may be used as external terminals for connection with power lines. For example, the first external electrode 131 may be connected to a power source terminal and the second external electrode 132 may be connected to a ground.

In this case, the exposed portions of the first internal electrodes 121 are electrically connected to the first external electrode 131 and the exposed portions of the second internal electrodes 122 are electrically connected to the second external electrode 132.

Also, exposed portions of the first lead portions 123*a* and 125*a* of the third internal electrodes 123 and 125 are electrically connected to the third external electrode 133, and exposed portions of the second lead portions 124*a* and 126*a* of the fourth internal electrodes 124 and 126 are electrically connected to the fourth external electrode 134.

The third and fourth external electrodes 133 and 134 may be used as external electrodes for adjusting ESR and may also be understood as non-contacting terminals.

According to the exemplary embodiment of the present disclosure, ESR of the MLCC may be increased in a high frequency region, relative to a low frequency region.

Also, the MLCC according to the present exemplary embodiment may be an MLCC for a DC-DC converter in which the capacitor unit having capacitance higher than that of the related art structure transmits required power and the ESR controller having relatively low capacitance suppresses resonance.

Therefore, in the MLCC according to the present exemplary embodiment as compared with the related art structure, ESR is low in a low frequency region and ESR is increased in a high frequency region, without affecting conversion efficiency, and thus, the MLCC may suppress a ringing phenomenon by ESR increased in the high frequency region to thereby reduce noise, without consuming a switching current required for conversion of power of a DC-DC converter.

The first to fourth external electrodes 131 to 134 may be formed of conductive paste including a conductive metal.

The conductive metal may be, for example, nickel (Ni), copper (Cu), tin (Sn), an alloy thereof, or the like, but the present disclosure is not limited thereto.

Also, the conductive paste may further include an insulating material. For example, the insulating material is glass, but the present disclosure is not limited thereto.

A method for forming the first to fourth external electrodes 131 to 134 is not particularly limited. The first to fourth external electrodes 131 to 134 may be formed by dipping the ceramic body 110 or using any other method, such as plating, or the like.

Meanwhile, first and second plated layers (not shown) may be formed on the first and second external electrodes 131 and 132.

The first and second plated layers may include a nickel (Ni) plated layer formed on the first and second external electrodes 131 and 132 and a tin (Sn) plated layer formed on the nickel plated layer.

The first and second plated layers serve to increase bonding strength when the MLCC 100 is mounted on a circuit board, or the like, by soldering. Plating may be performed through a known method, and preferably, lead (Pb)-free plating is performed in terms of environmentally-friendly factor, but the present disclosure is not limited thereto.

Meanwhile, according to the exemplary embodiment of the present disclosure, a mounting surface of the MLCC 100 may be the first main surface 1 of the ceramic body 110.

Namely, the MLCC 100 according to the exemplary embodiment of the present disclosure may be understood as being mounted using a bottom surface thereof, but the present disclosure is not limited thereto and the MLCC 100 may be mounted in various forms, as necessary.

In the exemplary embodiment of the present disclosure, referring to FIG. 2, a distance from the first main surface 1 of the ceramic body 110 to a lower end of the ESR controller is defined A, a distance from the first main surface 1 of the ceramic body 110 to a lower end of the capacitor unit is defined as B, a distance from the first main surface 1 of the ceramic body 110 to an upper end of the ESR controller is defined as C, and a height of the MLCC 100 is defined as T.

In this case, a ratio between a lower margin of the capacitor unit and a lower margin of the ESR controller may satisfy a range of $2.959 \leq B/A \leq 18.576$.

Also, a thickness (B−C) of the gap layer 113 may satisfy a range of $150.1\ \mu m \leq B-C \leq 1387.8\ \mu m$.

EXPERIMENTAL EXAMPLE

MLCCs according to Inventive Example and Comparative Example are manufactured as follows.

First, a plurality of ceramic sheets are prepared.

The ceramic sheets, which serve to form the dielectric layers 111 and 112 and the gap layer 113 of the ceramic body 110, may be fabricated as sheets each having a thickness of a few micrometers (μm) by mixing ceramic powder, a polymer, a solvent, or the like, to prepare slurry, applying the slurry to a carrier film through a doctor blade method, or the like, and drying the same.

Next, a conductive paste is printed to have a predetermined thickness on at least one surface of each of the plurality of ceramic sheets to form the first and second internal electrodes 121 and 122, thereby preparing the capacitor unit.

Here, the first and second internal electrodes 121 and 122 are formed to be exposed to both ends of the ceramic sheets, respectively.

A conductive paste is printed to have a predetermined thickness on at least one surfaces of some ceramic sheets to form the third and fourth internal electrodes 123 to 126, thereby preparing the ESR controller.

Here, the third and fourth internal electrodes 123 to 126 are formed to be exposed to both sides of the ceramic sheets.

As a method of printing the conductive paste, a screen printing method, a gravure printing method, or the like, may be used, but the present disclosure is not limited thereto.

Next, the ESR controller is disposed and the ceramic sheets having no internal electrode are stacked thereon to form the gap layer 113, and then, the capacitor unit is disposed thereon. The resultant structure is pressurized in the stacked direction to prepare a laminate body.

Thereafter, the laminate body is cut in every region corresponding to a single capacitor to forma chip, and the chip is sintered at high temperature to prepare the ceramic body 110 having the first and second main surfaces 1 and 2 opposing one another in the thickness direction, the first and second end surfaces 3 and 4 in the length direction to which the first and second internal electrodes 121 and 122 are alternately exposed, and the first and second lateral surfaces 5 and 6 in the width direction.

After sintering, a chip size of the multilayer ceramic capacitor is approximately 1.0 mm×0.5 mm (L×W, 1005 size). Here, manufacturing tolerance is determined as ±0.1 mm.

Thereafter, the first external electrode 131 is formed on the first end surface 3 of the ceramic body 110 such that it is in contact with and electrically connected to exposed portions of the first internal electrodes 121, and the second external electrode 132 is formed on the second end surface 4 of the ceramic body 110 such that it is in contact with and electrically connected to exposed portions of the second internal electrodes 122.

If necessary, after the forming of the first and second external electrodes 131 and 132, surfaces of the first and second external electrodes 131 and 132 may be plated through a method such as electroplating, or the like, to form first and second plated layers (not shown).

Thereafter, the third external electrode 133 is formed on the first lateral surface 5 of the ceramic body 110 such that it is in contact with and electrically connected to exposed portions of the first lead portions 123a and 125a of the third internal electrodes 123 and 125, and the fourth external electrode 134 is formed on the second lateral surface 6 of the ceramic body 110 such that it is in contact with and electrically connected to exposed portions of the second lead portions 124a and 126a of the fourth internal electrodes 124 and 126, thus completing the manufacturing of the MLCC 100.

Figure 5:
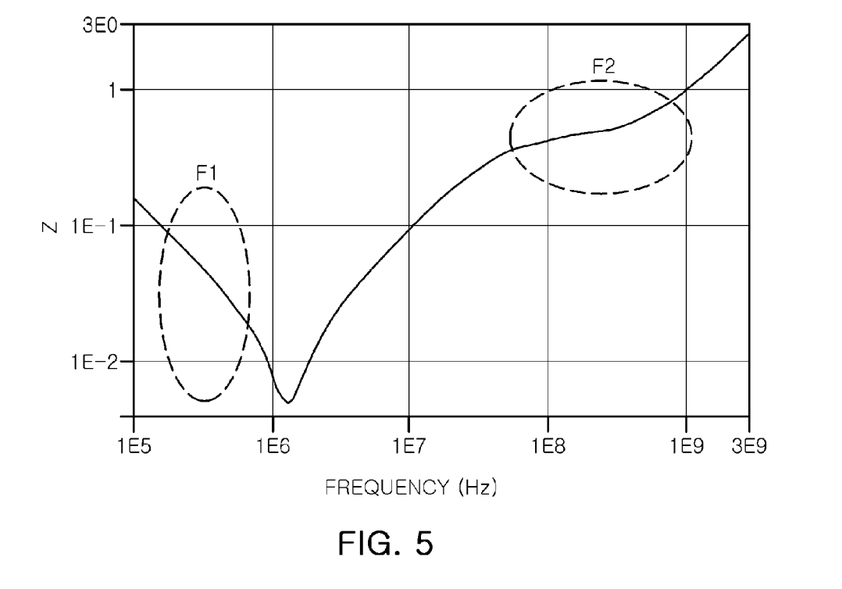
FIG. 5 is a graph illustrating impedance, in a low frequency region and a high frequency region, of an MLCC according to an exemplary embodiment of the present disclosure.
Figure 6:
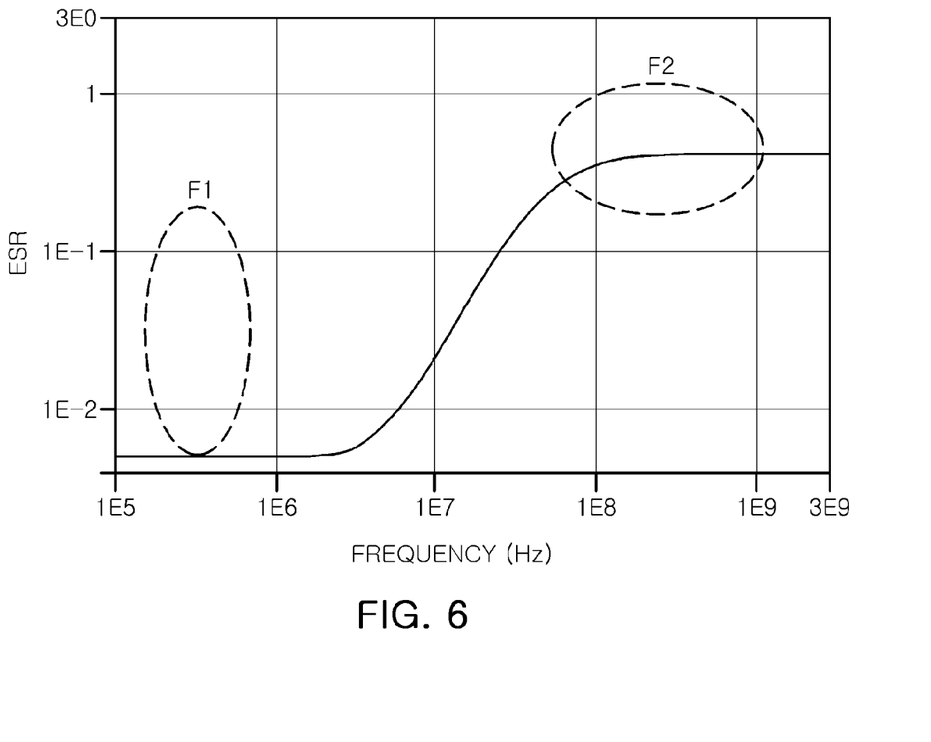
FIG. 6 is a graph illustrating equivalent series resistance (ESR), in a low frequency region and a high frequency region, of an MLCC according to an exemplary embodiment of the present disclosure.

FIG. 5 is a graph illustrating impedance, in a low frequency region and a high frequency region, of an MLCC according to an exemplary embodiment of the present disclosure, and FIG. 6 is a graph illustrating equivalent series resistance (ESR), in a low frequency region and a high frequency region, of an MLCC according to an exemplary embodiment of the present disclosure.

Referring to FIGS. 5 and 6, in the MLCC 100 configured as described above, by disposing the capacitor unit having relatively low ESR and high ESL in the upper portion of the ceramic body 110 and disposing the ESR controller having relatively high ESR and low ESL in the lower portion of the ceramic body 110 spaced apart by the gap layer 113, the MLCC 100 may operate as a capacitor in a low frequency region F1 and as a resistor in a high frequency region F2, whereby EMI noise may be canceled without degrading efficiency of the DC-DC converter.

Figure 7:
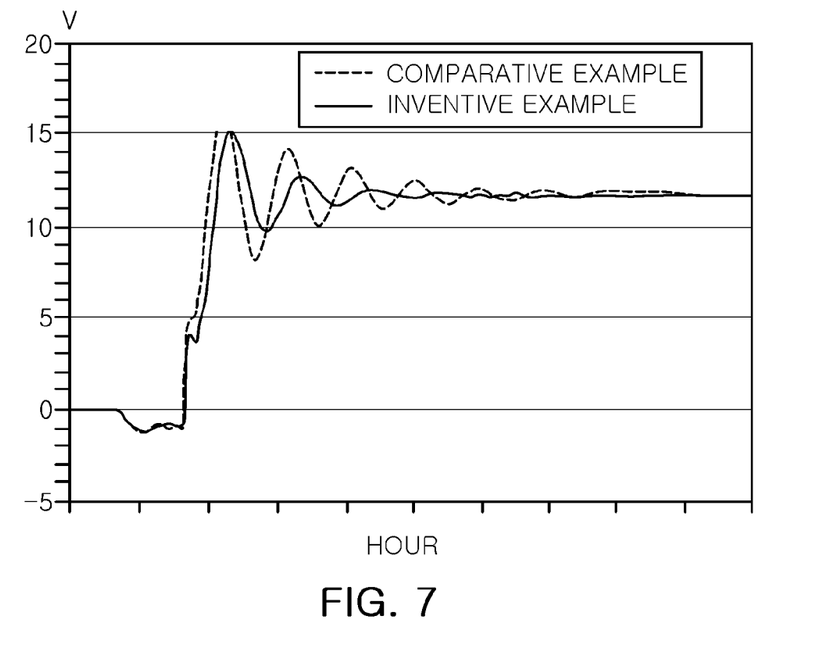
FIG. 7 is a graph illustrating power consumption of an MLCC according to the related art and an MLCC according to an exemplary embodiment of the present disclosure, over time.

FIG. 7 is a graph illustrating power consumption of an MLCC according to the related art and an MLCC according to an exemplary embodiment of the present disclosure over time.

Here, the related art MLCC, Comparative Example, does not have a gap layer and has a structure in which first internal electrodes are electrically connected to first and third external electrodes in parallel and second internal electrodes are connected to second and fourth external electrodes in parallel.

Referring to FIG. 7, it can be seen that, in Inventive Example, a ringing wave of a switching circuit is reduced to suppress radiation noise occurring due to ringing.

Also, since ESR is low in the low frequency region, an increase in power consumption is reduced, whereby the MLCC according to Inventive Example may be advantageously used in a low power circuit.

Table 1 shows the results by measuring whether an impedance inflection section is formed in the high frequency region F2 and whether a capacitor height specification is satisfied.

Here, a distance from the first main surface 1, a mounting surface, of the ceramic body 110 to a lower end of the ESR controller is defined as A, a distance from the first main surface 1 of the ceramic body 110 to a lower end of the capacitor unit is defined as B, a distance from the first main surface 1 of the ceramic body 110 to an upper end of the ESR controller is defined as C, and a height of the MLCC 100 is defined as T.

TABLE 1

| No. | A (um) | B (um) | C (um) | B − C (um) | Chip Height T (mm) | B/A | Impedance Inflection Section presence | Capacitor Height Specification (1.9 mm) satisfied |
|---|---|---|---|---|---|---|---|---|
| 1* | 80.2 | 138.7 | 88.0 | 50.7 | 0.533 | 1.730 | X | ○ |
| 2* | 80.0 | 188.2 | 87.6 | 100.6 | 0.581 | 2.352 | X | ○ |
| 3 | 80.3 | 237.6 | 87.5 | 150.1 | 0.632 | 2.959 | ○ | ○ |
| 4 | 79.8 | 237.5 | 87.4 | 200.1 | 0.686 | 3.602 | ○ | ○ |
| 5 | 80.1 | 437.8 | 87.8 | 350.0 | 0.834 | 5.465 | ○ | ○ |
| 6 | 80.4 | 589.6 | 88.2 | 501.4 | 0.987 | 7.333 | ○ | ○ |
| 7 | 80.2 | 1091.6 | 87.9 | 1003.7 | 1.489 | 13.611 | ○ | ○ |
| 8 | 79.4 | 1474.9 | 87.2 | 1387.8 | 1.869 | 18.576 | ○ | ○ |
| 9 | 79.7 | 1588.8 | 87.3 | 1501.5 | 1.983 | 19.935 | ○ | X |

Referring to Table 1, it can be seen that, in Samples 1 and 2 in which the ratio B/A between the lower margin of the capacitor unit and the lower margin of the ESR controller was less than 2.959, an impedance inflection section was not generated in a high frequency region.

Also, in Sample 9 in which the ratio B/A exceeded 18.576, a capacitor height specification exceeded 1.9 mm as a reference value.

Thus, it can be seen that a desirable range of B/A is $2.959 \leq B/A \leq 18.576$.

Also, in Samples 1 and 2 in which a thickness (B−C) of the gap layer was less than 150.1 μm, an impedance inflection section was not generated.

Also, in Sample 9 in which the thickness (B−C) exceeded 1387.8 μm, the capacitor height specification exceeded 1.9 mm.

Thus, it can be seen that a desirable range of B−C is 150.1 μm $\leq$ B−C $\leq$ 1387.8 μm.

MODIFIED EXAMPLE

The third and fourth internal electrodes according to an exemplary embodiment of the present disclosure may have various pattern shapes to adjust ESR of the MLCC, and ESR characteristics may be more precisely controlled according to pattern shapes.

Figure 8:
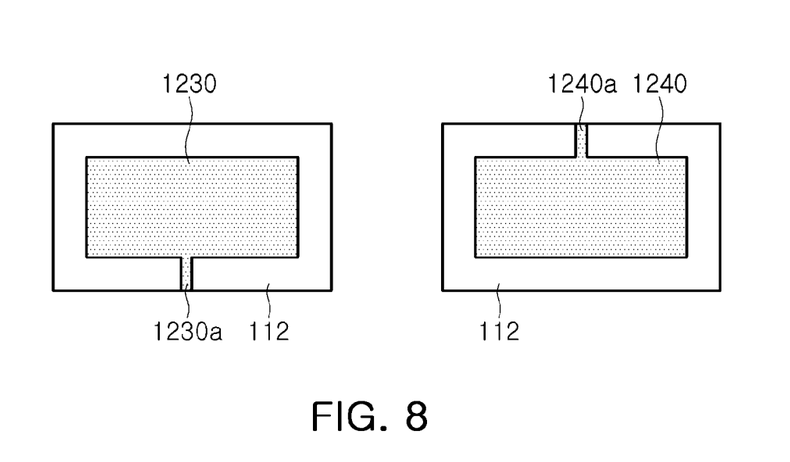
FIG. 8 is a plan view illustrating third and fourth internal electrodes of an MLCC according to another exemplary embodiment of the present disclosure.

FIG. 8 is a plan view illustrating third and fourth internal electrodes of an MLCC according to another exemplary embodiment of the present disclosure.

Here, the configuration of the ceramic body 110, the first and second internal electrodes 121 and 122 and the first to fourth external electrodes 131 to 134 in this exemplar embodiment is identical to that illustrated in the above-described exemplary embodiment, so a detailed description thereof will be omitted to avoid redundancy, and third and fourth internal electrodes 1230 and 1240 having a structure different from that of the foregoing exemplary embodiment will be illustrated and described in detail.

Referring to FIG. 8, in an MLCC according to another exemplary embodiment, first and second lead portions 1230a and 1240a of third and fourth internal electrodes 1230 and 1240 may be formed to linearly extend from the third and fourth internal electrodes 1230 and 1240 to the first and second lateral surfaces 5 and 6 of the ceramic body 110.

Figure 9:
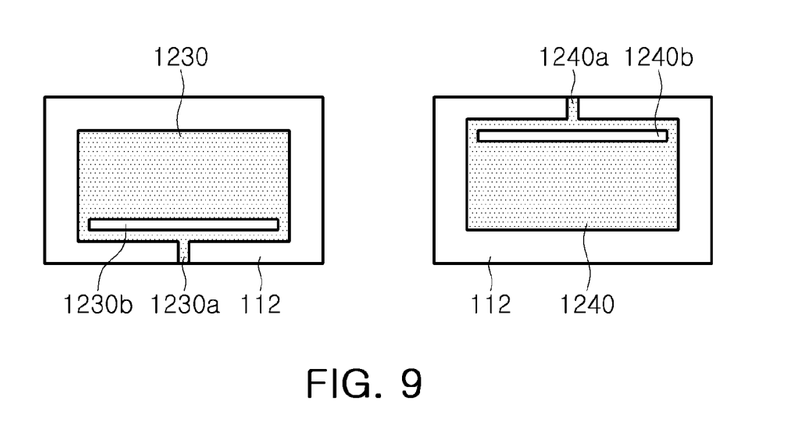
FIG. 9 is a plan view illustrating third and fourth internal electrodes of an MLCC according to another exemplary embodiment of the present disclosure.

FIG. 9 is a plan view illustrating third and fourth internal electrodes of an MLCC according to another exemplary embodiment of the present disclosure.

Here, the configuration of the ceramic body 110, the first and second internal electrodes 121 and 122, and the first to fourth external electrodes 131 to 134 is identical to that illustrated in the above-described exemplary embodiment, so a detailed description thereof will be omitted to avoid redundancy, and the third and fourth internal electrodes 1230 and 1240 having a structure different from that of the foregoing exemplary embodiment will be illustrated and described in detail.

Referring to FIG. 9, in this exemplary embodiment, first and second lead portions 1230a and 1240a of the third and fourth internal electrodes 1230 and 1240 may be formed to linearly extend from the third and fourth internal electrodes 1230 and 1240 to the first and second lateral surfaces 5 and 6 of the ceramic body 110.

Also, the third and fourth internal electrodes 1230 and 1240 may have recess portions 1230b and 1240b provided to be adjacent to the first and second lead portions 1230a and 1240a.

In the present exemplary embodiment, one recess portion is formed in each internal electrode, but the present disclosure is not limited thereto and the number and shape of the recess portions may be variously modified.

Board Having MLCC Mounted Thereon

Figure 10:
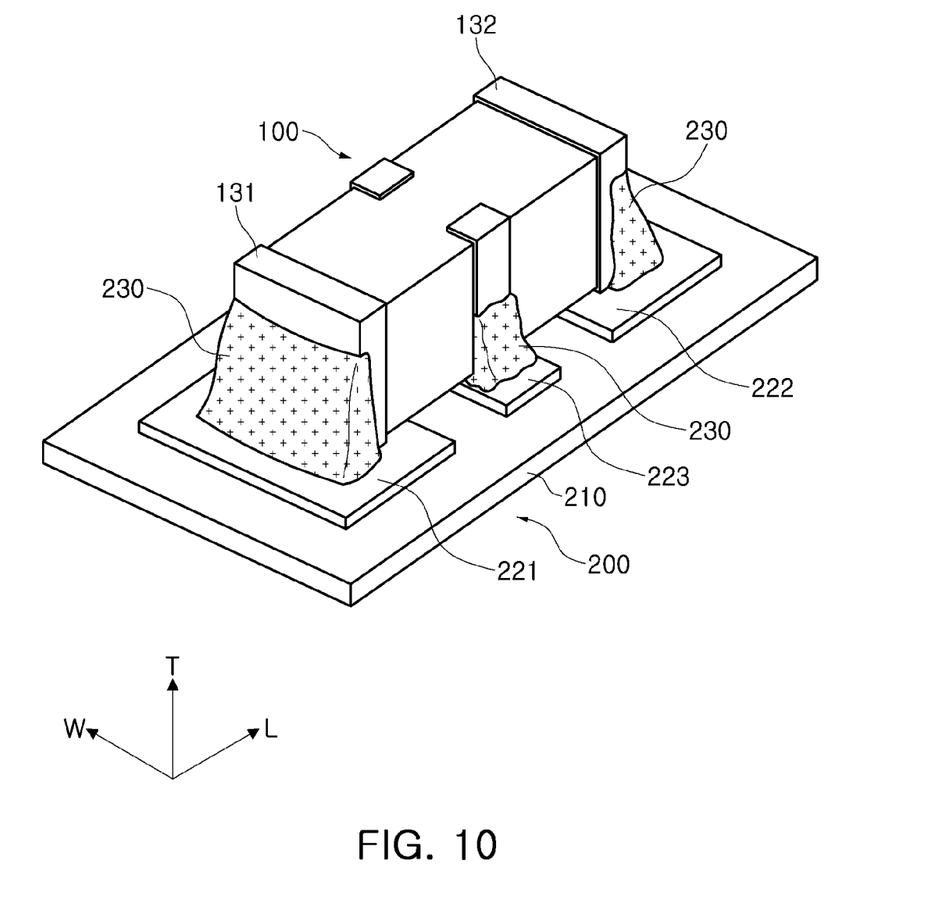
FIG. 10 is a perspective view illustrating an MLCC mounted on a board according to an exemplary embodiment of the present disclosure.
Figure 11:
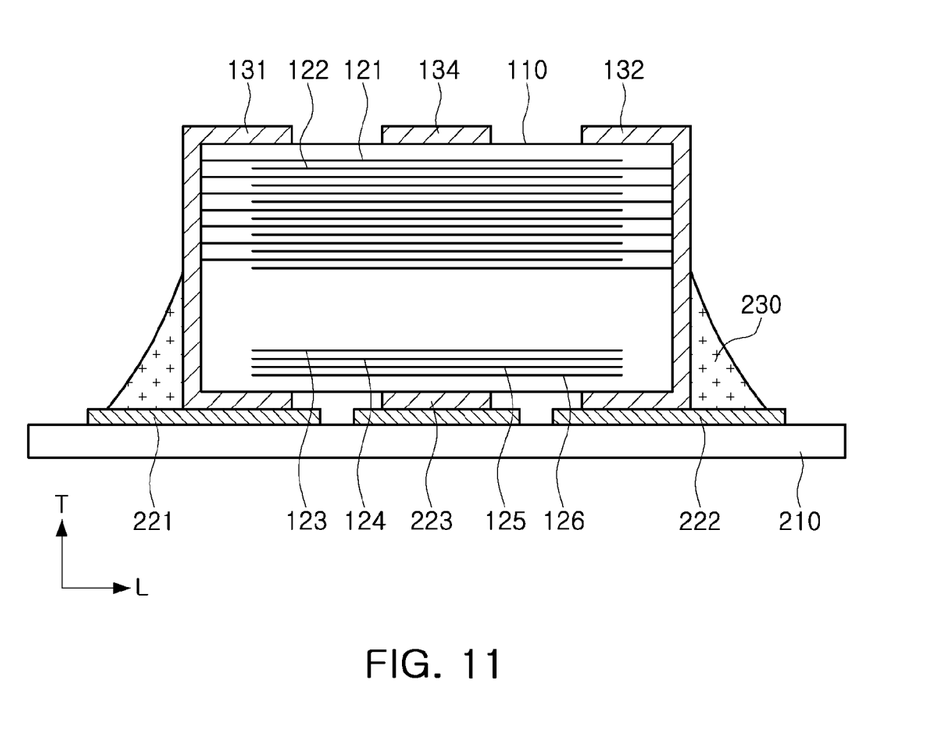
FIG. 11 is a cross-sectional view illustrating an MLCC mounted on a board according to an exemplary embodiment of the present disclosure.

FIG. 10 is a perspective view illustrating an MLCC mounted on a board according to an exemplary embodiment of the present disclosure, and FIG. 11 is a cross-sectional view illustrating an MLCC mounted on a board according to an exemplary embodiment of the present disclosure.

Referring to FIGS. 10 and 11, a board having an MLCC mounted thereon according to an exemplary embodiment of the present disclosure may include a board 210 on which the MLCC 100 is horizontally mounted, first and second electrode pads 221 and 222 disposed to be spaced apart from one another on an upper surface of the board 210, a third electrode pad 223 disposed between the first and second electrode pads 221 and 222, and a fourth electrode pad (not shown). The fourth electrode pad is not displayed in the drawing, but may be positioned to be spaced apart from the third electrode pad 223 in the width direction of the MLCC.

Here, the MLCC 100 may be mounted on the board 210 such that the first main surface 1 thereof faces the board 210, and may be electrically connected to the board 210 by solders 230 in a state in which the first and second external electrodes 131 and 132 are positioned to contact the first and second electrode pads 221 and 222, the third electrode pad 223 is positioned to contact the third external electrode 133, and the fourth electrode pad is positioned to contact the fourth electrode 134.

As set forth above, according to exemplary embodiments of the present disclosure, by disposing a capacitor unit having relatively low ESR and high ESL in an upper portion of a ceramic body and disposing an ESR controller having relatively high ESR and low ESL in a lower portion of the ceramic body spaced apart in a thickness direction by a gap layer, a multilayer ceramic capacitor may operate as a capacitor in a low frequency region and operate as a resistor in a high frequency region.

Thus, the multilayer ceramic capacitor according to the exemplary embodiment of the present disclosure may operate as a multilayer ceramic capacitor for a DC-DC converter in which the capacitor unit having large capacitance transmits required power and the ESR controller having relatively small capacitance restrains resonance. Thus, resonance may be suppressed and noise may be reduced, compared to the related art structure.

Also, since the multilayer ceramic capacitor according to the exemplary embodiment of the present disclosure has characteristics that ESR is low in a low frequency region and ESR is increased in a high frequency region, a ringing phenomenon may be suppressed by ESR increased in a high frequency region, without consuming a switching current required for conversion of power of the DC-DC converter.

In addition, by reducing an interval between non-contacting terminals in the above structure, components may be miniaturized, and thus, the components may be used at a higher current level and a mounting space and cost may be reduced.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic capacitor, comprising:
a ceramic body including a plurality of dielectric layers, first and second main surfaces opposing one another in a thickness direction, first and second end surfaces opposing one another in a length direction, and first and second lateral surfaces opposing one another in a width direction;
a capacitor unit disposed in an upper portion of the ceramic body and including a plurality of first and second internal electrodes, which are disposed with the respective dielectric layers interposed between the first and second internal electrodes while being alternately exposed to the first and second end surfaces of the ceramic body;
an equivalent series resistance (ESR) controller disposed in a lower portion of the ceramic body and including a plurality of third and fourth internal electrodes, which are disposed with the dielectric layers interposed between the third and fourth electrodes while being alternately exposed to the first and second lateral surfaces of the ceramic body;
a gap layer disposed between the capacitor unit and the ESR controller;
first and second external electrodes disposed on the first and second end surfaces of the ceramic body and electrically connected to the first and second internal electrodes; and
third and fourth external electrodes disposed on the first and second lateral surfaces of the ceramic body and electrically connected to the third and fourth internal electrodes,
wherein when a distance from the mounting surface of the ceramic body to a lower end of the ESR controller is defined as A and a distance from the mounting surface of the ceramic body to a lower end of the capacitor unit is defined as B, $2.959 \leq B/A \leq 18.576$ is satisfied.

2. The multilayer ceramic capacitor of claim 1, wherein the third and fourth internal electrodes have first and second lead portions exposed to the first and second lateral surfaces of the ceramic body.

3. The multilayer ceramic capacitor of claim 2, wherein the first and second lead portions are disposed to primarily extend from the third and fourth internal electrodes toward the first and second lateral surfaces of the ceramic body, are bent in the length direction and secondarily extend along the first and second lateral surfaces, and are bent in the width direction and tertiarily extend to the first and second lateral surfaces.

4. The multilayer ceramic capacitor of claim 2, wherein the first and second lead portions linearly extend from the third and fourth internal electrodes to the first and second lateral surfaces of the ceramic body.

5. The multilayer ceramic capacitor of claim 2, wherein the third and fourth internal electrodes have at least one recess portion provided to be adjacent to the first and second lead portions.

6. The multilayer ceramic capacitor of claim 1, wherein the first main surface of the ceramic body is a mounting surface.

7. The multilayer ceramic capacitor of claim 1, wherein the ESR controller has higher ESR than the capacitor unit and has lower equivalent series inductance (ESL) than the capacitor unit.

8. A multilayer ceramic capacitor, comprising:
a ceramic body, including a plurality of dielectric layers, first and second main surfaces opposing one another in a thickness direction, first and second end surfaces opposing one another in a length direction, and first and second lateral surfaces opposing one another in a width direction;
a capacitor unit disposed in an upper portion of the ceramic body and including a plurality of first and second internal electrodes, which are disposed with the respective dielectric layers interposed between the first and second internal electrodes while being alternately exposed to the first and second end surfaces of the ceramic body;
an equivalent series resistance (ESR) controller disposed in a lower portion of the ceramic body and including a plurality of third and fourth internal electrodes, which are disposed with the respective dielectric layers interposed between the third and fourth electrodes while being alternately exposed to the first and second lateral surfaces of the ceramic body;
a gap layer disposed between the capacitor unit and the ESR controller;
first and second external electrodes disposed on the first and second end surfaces of the ceramic body and electrically connected to the first and second internal electrodes; and
third and fourth external electrodes disposed on the first and second lateral surfaces of the ceramic body and electrically connected to the third and fourth internal electrodes,
wherein when a distance from the mounting surface of the ceramic body to a lower end of the capacitor unit is defined as B and a distance from the mounting surface of the ceramic body to an upper end of the ESR controller is defined as C, $150.1 \ \mu m \leq B-C \leq 1387.8 \ \mu m$ is satisfied.

9. A board with a multilayer ceramic capacitor mounted thereon, the board comprising:

a board having first and second electrode pads disposed to be spaced apart from one another in a length direction and third and fourth electrode pads disposed to be spaced apart from one another in a width direction between the first and second electrode pads; and the multilayer ceramic capacitor of claim 1, having the first to fourth external electrodes in contact with the first to fourth electrode pads of the board, respectively, and mounted on the board.

10. The multilayer ceramic capacitor of claim 8, wherein the third and fourth internal electrodes have first and second lead portions exposed to the first and second lateral surfaces of the ceramic body.

11. The multilayer ceramic capacitor of claim 10, wherein the first and second lead portions are disposed to primarily extend from the third and fourth internal electrodes toward the first and second lateral surfaces of the ceramic body, are bent in the length direction and secondarily extend along the first and second lateral surfaces, and are bent in the width direction and, thirdly, extend to the first and second lateral surfaces.

12. The multilayer ceramic capacitor of claim 10, wherein the first and second lead portions linearly extend from the third and fourth internal electrodes to the first and second lateral surfaces of the ceramic body.

13. The multilayer ceramic capacitor of claim 10, wherein the third and fourth internal electrodes have at least one recess portion provided to be adjacent to the first and second lead portions.

14. The multilayer ceramic capacitor of claim 8, wherein the first main surface of the ceramic body is a mounting surface.

15. The multilayer ceramic capacitor of claim 8, wherein the ESR controller has a higher ESR than the capacitor unit and has lower equivalent series inductance (ESL) than the capacitor unit.

* * * * *